(12) United States Patent
Natarajan et al.

(10) Patent No.: US 7,684,194 B2
(45) Date of Patent: Mar. 23, 2010

(54) SYSTEMS AND METHODS FOR COOLING AN ELECTRONIC DEVICE

(75) Inventors: Govindarajan Natarajan, Poughkeepsie, NY (US); Raschid J. Bezama, Mahopac, NY (US); David L. Gardell, Fairfax, VA (US); James N. Humenik, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/132,882

(22) Filed: Jun. 4, 2008

(65) Prior Publication Data

US 2009/0303684 A1 Dec. 10, 2009

(51) Int. Cl.
*H05K 7/20* (2006.01)
*G01R 31/26* (2006.01)

(52) U.S. Cl. .................. 361/698; 361/691; 361/700; 361/702; 361/704; 361/718; 165/104.33; 165/908; 324/765

(58) Field of Classification Search ........... 361/69–699, 361/702, 704, 709, 718; 165/80.3, 104.33, 165/185, 908; 324/158.1, 760, 765
See application file for complete search history.

(56) References Cited

U.S. PATENT DOCUMENTS

| | | | | |
|---|---|---|---|---|
| 5,219,020 A * | 6/1993 | Akachi | .................. | 165/104.26 |
| 6,098,897 A * | 8/2000 | Lockwood | .................... | 239/8 |
| 6,498,725 B2 * | 12/2002 | Cole et al. | .................. | 361/700 |
| 6,836,131 B2 * | 12/2004 | Cader et al. | ................. | 324/760 |
| 7,219,713 B2 | 5/2007 | Gelorme et al. | | |
| 7,264,041 B2 | 9/2007 | Karidis et al. | | |
| 2005/0270746 A1* | 12/2005 | Reis | ........................... | 361/708 |
| 2006/0144567 A1* | 7/2006 | Zhu et al. | .............. | 165/104.29 |
| 2007/0252610 A1* | 11/2007 | Audette et al. | .............. | 324/760 |

* cited by examiner

*Primary Examiner*—Jayprakash N Gandhi
*Assistant Examiner*—Robert J Hoffberg
(74) *Attorney, Agent, or Firm*—Cantor Colburn LLP; Joseph Petrokaitis

(57) ABSTRACT

Systems and methods for cooling electronic devices via enhanced thermal conduction in the gap separating an electronic device from a heat sink are provided. In one embodiment, a system for cooling an electronic device comprises: a heat sink spaced from the integrated circuit by a gap; and a bubbler and an atomizer configured to feed a mixture comprising an atomized liquid and a carrier gas to the gap.

23 Claims, 3 Drawing Sheets

SYSTEMS AND METHODS FOR COOLING AN ELECTRONIC DEVICE

BACKGROUND OF THE INVENTION

1. Field of the Invention

This invention relates to electronic devices, and particularly to systems and methods for cooling electronic devices using liquid mist distributed in a carrier gas mixture to enhance thermal conduction in the gap separating an electronic device from a heat sink.

2. Description of Background

During the normal operation of electronic devices, particularly integrated circuit devices, significant amounts of heat can be generated. Therefore, these devices are subjected to even higher power or heat generation during the test and burn-in process. This heat can be continuously removed to prevent the integrated circuit device from overheating and resulting in damage to the device and/or a reduction in operating performance. Cooling devices, such as heat sinks, generally have been used in conjunction with integrated circuit devices to avoid such overheating. For example, a passive heat sink in combination with a system fan has been employed as a relatively simple means for cooling integrated circuits. In recent years, however, the power of integrated circuit devices has increased exponentially, resulting in a significant increase in the amount of heat generated by those devices. Consequently, it has become extremely difficult to extract a sufficient amount of heat from those devices to prevent them from overheating during test and burn-in.

Current methods for cooling integrated circuit devices involve conducting heat from the microprocessor chip to a heat sink comprising metal and then radiating the heat into the air. The better the transfer of heat between the chip and the heat sink metal, the better is the cooling. Some processors are packaged with air cooled heat sinks attached to them directly, while others include a thermal interface material (TIM), such as a thin, soft layer of thermal paste or high thermal conductivity solder at the interface between the chip and the heat sink. In test and burn-in operations, removable solids, liquids, and gases with thermal conductivities higher than air, e.g., helium, are generally preferred. The TIM serves not only to transfer heat from the chip to the heat sink but also provides some degree of mechanical compliance to compensate for mechanical stresses between the chip and the heat sink such as dimensional changes driven by the high operating temperatures of the chip. The thermal resistance of current thermal pastes is unfortunately higher than desired. Thus, thermal pastes have been replaced with lower thermal resistance materials such as indium for field applications. Also, TIM's previously used for die test and burn-in operations, e.g., helium, have been replaced with propylene glycol, which has an even higher thermal conductivity. Unfortunately, propylene glycol (PG) or PG with water can cause corrosion to integrated circuit devices and also can lead to the build up of a contaminating residue that remains after testing.

Further, there is a continuing need to improve the reliability of integrated circuit devices, which is defined as the lifetime performance integrity of a device under normal operating conditions. Integrated circuit manufacturers usually test their products to predict the average lifetime thereof in a short time by subjecting them to accelerated tests. Such tests utilize tougher working conditions than normal, e.g., higher temperature, voltage, current, and/or pressure, to test the lifetime of devices in harsh conditions. The challenge as far as the cooling capability is concerned is that the TIM's functionality desirably facilitates such testing at higher power dissipation levels without compromising overall structural integrity. Moreover, die testing can require detachable (or removable by drying, evaporation, etc.) TIM materials that can be easily introduced at the beginning of the test and removed without any trace on the product after the testing.

SUMMARY OF THE INVENTION

The shortcomings of the prior art are overcome and additional advantages are provided through the provision of systems and methods for cooling electronic devices via enhanced thermal conduction in the gap separating a device from a heat sink. In one embodiment, a system for cooling an electronic device comprises: a heat sink spaced from the integrated circuit by a gap; and a bubbler and an atomizer configured to feed a mixture comprising an atomized liquid and a carrier gas to the gap.

In another embodiment, a method for cooling an electronic device, comprising: feeding a mixture comprising an atomized liquid and a carrier gas to a gap interposed between a heat sink and the integrated circuit.

In yet another embodiment, a system for cooling an electronic device comprises: a heat sink spaced from the electronic device by a cluster of micro liquid bumps; a flow network to surround the micro liquid bumps by a carrier gas; and a vacuum assembly to sweep fluids from the system.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
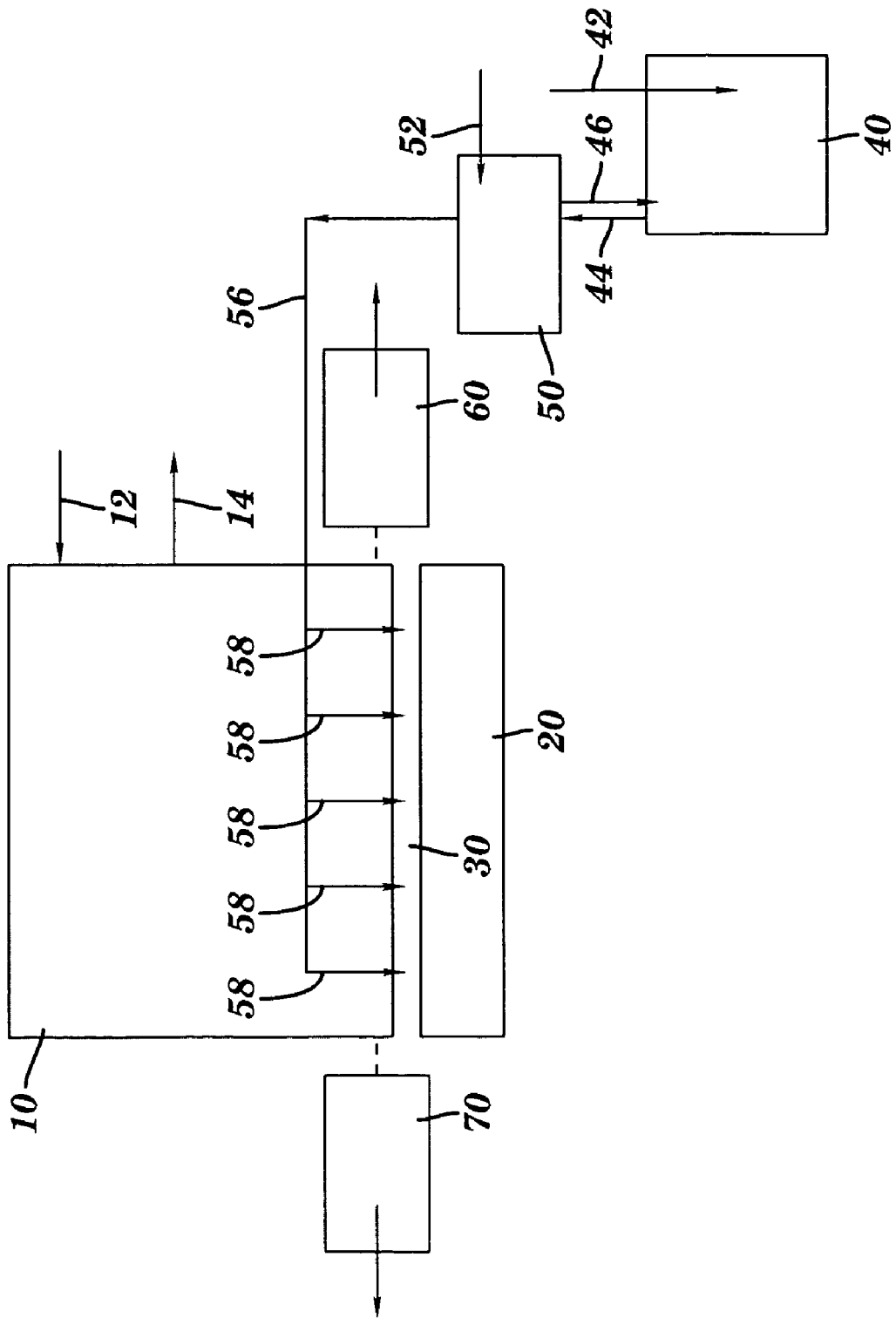
FIG. 1 schematically illustrates one example of a system for cooling an electronic device using an atomized liquid mist/carrier gas mixture to enhance thermal conduction in the gap separating an electronic device from a heat sink.

Turning now to the drawings in greater detail, it will be seen that in FIG. 1 there is an exemplary embodiment of a system for cooling an electronic device such as an integrated circuit chip. The cooling system in FIG. 1 includes a heat sink 10 spaced from an electronic device 20 by a gap 30, and a bubbler 40 and an atomizer 50 configured to feed a mixture comprising an atomized liquid and a saturated carrier gas to the gap 30. The gap 30 can be considered a distribution of micro-gaps, wherein a "micro-gap" is herein defined as a depth for a given unit area that holds a thin liquid film having a volume of less than 2 micro-gram/mm$^2$, more specifically less than 0.5 micro-gram/mm$^2$. Under such conditions, capillary force predominates, and any micro-droplet touching the lid and die surfaces can have a relative internal pressure of about 2500 Pascals (Pa) over the ambient pressure. Feeding the atomized liquid/carrier gas mixture to the gap 30 separating the heat sink 10 from the electronic device 20 provides a relatively inexpensive way to increase the effective thermal conductivity in the gap without being concerned that the mixture could damage the device 20 by corrosion, etc. The atomized liquid/carrier gas mixture can serve as a mechanically compliant thermal interface material that decouples mechanical stresses between the device 30 and the heat sink 10. Moreover, the atomized liquid/carrier gas mixture dries quickly on completion of the test cycle and enhances the throughput. The cooling capability of the system depicted in FIG. 1 is less likely to be compromised when subjected to accelerated lifetime tests like those currently applied to high frequency microprocessor chips as compared to prior art thermal interface materials. It is understood that multiple dies, semiconductor devices, and/or simple devices can be tested, cooled, and/or heated using the systems described herein.

The heat sink 10 depicted in FIG. 1 can comprise, for example, a metallic plate having flow passages through which a coolant flows. A coolant, e.g., water, can be continuously fed to those flow passages via coolant feedstream 12 and removed from those flow passages via coolant exit stream 14 for increasing the cooling capacity of the heat sink 10.

The atomized liquid/carrier gas mixture, i.e., feed stream 56, can be formed by first feeding a carrier gas 42, into the bubbler 40, containing a liquid that is capable of being atomized. The carrier gas 42 is a gas or a gas mixture desirably having a mean free path less than about 0.2 microns, more specifically less than about 0.15 microns. It can be non-reactive and can comprise a species with or without a relatively higher thermal conductivity than air. The bubbler 40 can be configured to ensure that the carrier gas stream 42 is effectively saturated. A saturated carrier gas stream 44 can then be sent to the atomizer 50 where an atomized liquid spray 52 is combined therewith to form the liquid feed stream 56. Atomized liquid not captured by the saturated carrier gas can be collected and fed into the bubbler 40 via an intermediate liquid stream 46 for recycle. Current atomizers suitable for producing a liquid mist comprising liquid droplets having a nominal dimension of less than about 2 micrometers (μm), more specifically about 1 μm, can be employed as the atomizer 50. The feedstream 56 can be separated into multiple feedstreams 58 inside the heat sink 10, the outputs of which are relatively evenly distributed across the gap 30 to allow the mixture to be uniformly distributed across the gap 30. One or more vacuum systems 60 and 70 can be disposed downstream from the gap 30 for continuously applying a vacuum to remove exiting liquid/gas components from the gap 30. The cooling system of FIG. 1 is desirably a continuous system such that the atomized liquid/carrier gas mixture is continuously supplied to randomly distribute liquid islands of random contours surrounded by the saturated carrier gas, but governed by the capillary forces, within the gap 30. As such, the various streams of the cooling system can be pumped at relatively constant rates. However, it is understood that the system could also intermittently feed the feed stream 56 to the gap 30. Further, it could also operate as a closed loop system.

Examples of suitable liquids that can be fed to atomizer 50 include but are not limited to water, organic materials such as methanol, ethanol, propanol, and acetone, polymeric materials, and combinations comprising at least one of the foregoing. Examples of suitable carrier gases include but are not limited to inert gases that can be fed to bubbler 40 such as helium, argon, hydrogen, nitrogen, and combinations comprising at least one of the foregoing. The weight fraction of the atomized liquid relative to the carrier gas can be less than about 1%, more specifically less than about 0.2%. The flow rate of the carrier gas stream 42 can be less than about 10 cc/min. per die.

Figure 2B:
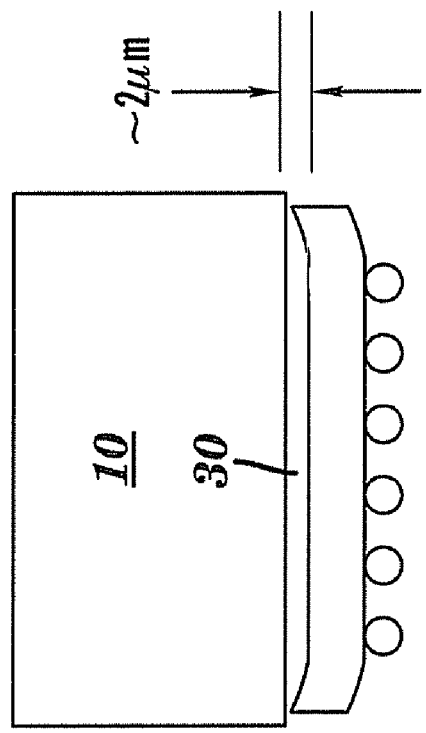
FIGS. 2(a) and 2(b) illustrates variations that can occur in the size of the gap between the electronic device and the heat sink due to mechanical stresses.
Figure 2A:
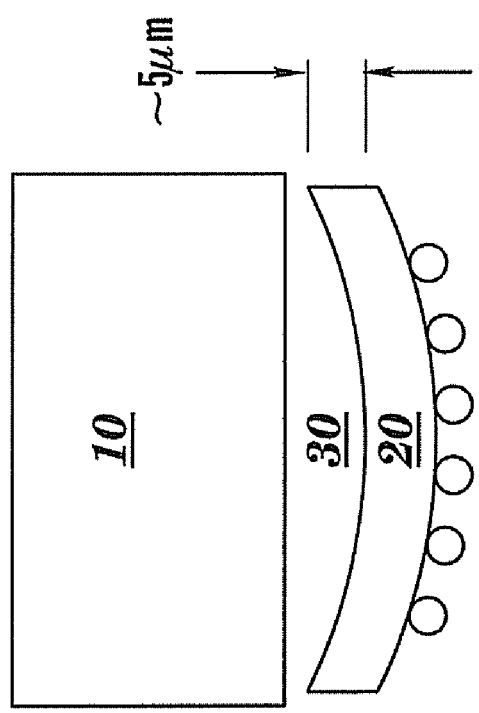

As illustrated in FIGS. 2(*a*) and 2(*b*), the size of the gap 30 interposed between the heat sink 10 and the electronic device 20, e.g., an integrated circuit chip, can vary depending on the load applied to the device 20 by and via the heat sink 10, the thermal coefficients of expansion of the device materials, the bond and assembly process used, and the inherent surface topography of the device 20 such as bow and camber. For example, the device 20 can experience a significant amount of warpage as shown in FIG. 2(*a*), resulting in the gap size being as large as about 5 μm. Through proper engineering, the surface of the device 20 facing the gap 30 can be brought to near planar, resulting in the gap size being as small as about 2 μm, as shown in FIG. 2(*b*). As an example, when a 19 mm×19 mm×0.8 mm silicon chip (assembled through the IBM chip attach process to a substrate) in contact with a copper heat sink with an applied load of 3.6 kg to 6.4 kg is employed, the gap size can range from about 2.2 μm (corresponds with 3.6 kg load) to about 1.8 μm (corresponds with 6.4 kg load).

Figure 3:
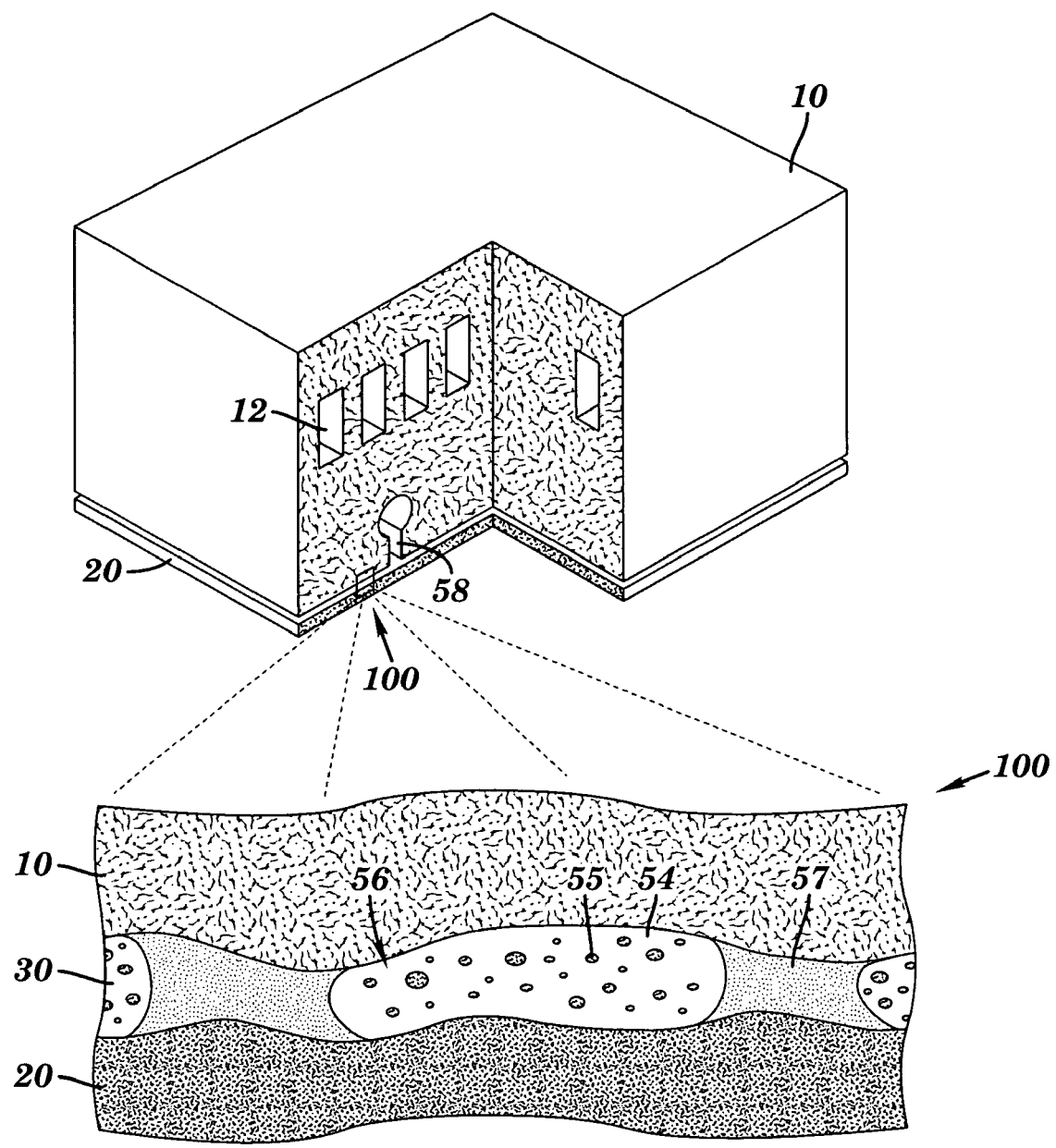
FIG. 3 schematically illustrates the effect of having a liquid mist/carrier gas mixture flowing through the gap that separates an electronic device from a heat sink.

It is to be understood that the surfaces forming the gap 30 can have surface topographies significantly more complex than what is depicted in FIGS. 2(*a*) and 2(*b*), both in the case of the device 20 and the heat sink 10. For example, multiple peaks and valleys can be present on both surfaces, but the variability of the topography range is usually constrained within the nominal 2 μm range example shown in FIG. 2(*b*). This situation is partially illustrated in FIG. 3, which depicts a small section 100 of gap 30 with sufficient magnification to show details of the topography. Without intending to be limited by theory, it is believed that the different elements present within any small section of gap 30 include: at least one feed stream 56 that carries micro liquid droplets 55 in at least one saturated gas phase 54 comprising at least one species; and micro liquid bumps 57 (e.g., as clusters of randomly distributed bumps), which when put together thermally interconnect the two surfaces defining gap 30. The liquid bumps 57 can be formed from the coalescence of the liquid droplets 55 that are captured by either one of the two surfaces that define the gap 30. Initially, the captured liquid droplets 55 most likely coalesce preferentially at places where the gap 30 is smaller than the average gap size driven by surface tension (wetting characteristics and surface roughness). Then at equilibrium, the distributed random fractional area covered by the liquid bumps 57 can be a function of the gap geometry 30 and several adjustable operational parameters such as the operating temperature of the electronic device 20, the temperature, flow rate, and liquid loading of the composite feed stream 56, the average diameter of the liquid droplet 55, the applied load on the heat sink 10 and the device 20, and the operating temperature of the heat sink 10.

In terms of the resulting performance improvement of using the liquid/carrier gas systems described herein, an improvement of up to three fold over the carrier gas by itself can be achieved, depending on the geometry and random distribution of the liquid bumps. Further, the systems and methods described herein achieve the same results as using pure liquid but require less liquid quantity in test applications. As such, the system beneficially affects the cost, quality, and reliability of the product. Further, it is to be understood that the systems and methods described herein can be utilized for heating and cooling of electronic and non-electronic devices.

The cooling systems and methods disclosed herein can be controlled using software, firmware, hardware, or some combination thereof. As one example, the cooling system depicted in FIG. 1 can be included in an article of manufacture (e.g., one or more computer program products) having, for instance, computer usable media. The media has embodied therein, for instance, computer readable program code means for controlling the system. The article of manufacture can be included as a part of a computer system or sold separately.

Additionally, at least one program storage device readable by a machine, tangibly embodying at least one program of instructions executable by the machine to control the cooling systems and methods disclosed herein can be provided.

As used herein, the terms "a" and "an" do not denote a limitation of quantity but rather denote the presence of at least one of the referenced items. Moreover, ranges directed to the same component or property are inclusive of the endpoints given for those ranges (e.g., "about 5 wt % to about 20 wt %," is inclusive of the endpoints and all intermediate values of the range of about 5 wt % to about 20 wt %). Reference throughout the specification to "one embodiment", "another embodiment", "an embodiment", and so forth means that a particular element (e.g., feature, structure, and/or characteristic) described in connection with the embodiment is included in at least one embodiment described herein, and might or might not be present in other embodiments. In addition, it is to be understood that the described elements may be combined in any suitable manner in the various embodiments. Unless defined otherwise, technical and scientific terms used herein have the same meaning as is commonly understood by one of skill in the art to which this invention belongs.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A system for cooling an electronic device, the system comprising: a heat sink spaced apart from the electronic device by a gap; and the heat sink configured to introduce one or more feedstreams into the gap, the one or more feedstreams comprising a mixture of micro liquid droplets that are initially atomized within a carrier gas; wherein a weight fraction of the atomized liquid droplets relative to the carrier gas, and a flow rate of the one or more feedstreams are such that first regions of the gap are occupied by the mixture of micro liquid droplets remaining atomized within the carrier gas, and second regions of the gap are occupied by liquid bumps formed form a coalescence of micro liquid droplets that are no longer atomized; and wherein; the first regions of the gap are occupied by the mixture of micro liquid droplets remaining atomized within the carrier gas corresponds to regions of greater distance between the electronic device and the heat sink, with respect to the second regions of the gap occupied by the liquid bumps formed form the coalescence of micro liquid droplets that are no longer atomized.

2. The system of claim 1, wherein the weight fraction of the atomized liquid droplets relative to the carrier gas is less than about 1%.

3. The system of claim 1, wherein the weight fraction of the atomized liquid droplets relative to the carrier gas is less than about 0.2%.

4. The system of claim 1, wherein the flow rate of the one or more feedstreams is less than about 10 cc/min.

5. The system of claim 1, wherein the micro liquid droplets have a dimension of less than about 2 micrometers.

6. The system of claim 1, wherein the micro liquid droplets have a dimension of less than about 1 micrometer.

7. The system of claim 1, wherein the micro liquid droplets comprise one or more of: water, methanol, ethanol, propanol, acetone, polymeric materials, and combinations thereof.

8. The system of claim 1, wherein the carrier gas is an inert material comprising one or more of: helium, argon, hydrogen, nitrogen, and combinations thereof.

9. The system of claim 8, wherein the carrier gas has a mean free path less than about 0.2 micrometers.

10. The system of claim 8, wherein the carrier gas has a mean free path less than about 0.15 micrometers.

11. The system of claim 1, further comprising:
a bubbler containing liquid used to produce the micro liquid droplets, the bubbler having the carrier gas input thereto;
an atomizer in fluid communication with the bubbler, the atomizer receiving a saturated carrier gas stream as an input thereto, the saturated carrier gas stream comprising the carrier gas saturated with the liquid used to produce the micro liquid droplets, wherein the atomizer combines the saturated carrier gas stream with an atomized liquid spray to produce the one or more feedstreams.

12. The system of claim 11, further comprising one or more vacuum systems configured to remove liquid and gas materials from the gap.

13. A method of cooling an electronic device, the method comprising: introducing one or more feedstreams into a gap between a heat sink and the electronic device, the one or more feedstreams comprising a mixture of micro liquid droplets that are initially atomized within a carrier gas; wherein a weight fraction of the atomized liquid droplets relative to the carrier gas, and a flow rate of the one or more feedstreams are such that first regions of the gap are occupied by the mixture of micro liquid droplets remaining atomized within the carrier gas, and second regions of the gap are occupied by liquid bumps formed form a coalescence of micro liquid droplets that are no longer atomized; and;
the first regions of the gap are occupied by the mixture of micro liquid droplets remaining atomized within the carrier gas corresponds to regions of greater distance between the electronic device and the heat sink, with respect to the second regions of the gap occupied by the liquid bumps formed form the coalescence of micro liquid droplets that are no longer atomized.

14. The method of claim 13, wherein the weight fraction of the atomized liquid droplets relative to the carrier gas is less than about 1%.

15. The method of claim 13, wherein the weight fraction of the atomized liquid droplets relative to the carrier gas is less than about 0.20%.

16. The method of claim 13, wherein the flow rate of the one or more feedstreams is less than about 10 cc/min.

17. The method of claim 13, wherein the micro liquid droplets have a dimension of less than about 2 micrometers.

18. The method of claim 13, wherein the micro liquid droplets have a dimension of less than about 1 micrometer.

19. The method of claim 13, wherein the micro liquid droplets comprise one or more of: water, methanol, ethanol, propanol, acetone, polymeric materials, and combinations thereof.

20. The method of claim 13, wherein the carrier gas is an inert material comprising one or more of: helium, argon, hydrogen, nitrogen, and combinations thereof.

21. The method of claim 20, wherein the carrier gas has a mean free path less than about 0.2 micrometers.

22. The method of claim 20, wherein the carrier gas has a mean free path less than about 0.15 micrometers.

23. The method of claim 13, further comprising:
configuring a bubbler containing liquid to produce the micro liquid droplets, the bubbler having the carrier gas input thereto;
configuring an atomizer in fluid communication with the bubbler, the atomizer receiving a saturated carrier gas stream as an input thereto, the saturated carrier gas stream comprising the carrier gas saturated with the liquid used to produce the micro liquid droplets, wherein the atomizer combines the saturated carrier gas stream with an atomized liquid spray to produce the one or more feedstreams; and
configuring one or more vacuum systems to remove liquid and gas materials from the gap.

* * * * *